United States Patent
Wang et al.

(10) Patent No.: US 7,049,639 B2
(45) Date of Patent: May 23, 2006

(54) LED PACKAGING STRUCTURE

(75) Inventors: Bily Wang, Hsin Chu (TW); Jonnie Chuang, Pan Chiao (TW); Chuanfa Lin, Shu Lin (TW); Heng-Yen Lee, Hsin Chu Hsien (TW)

(73) Assignee: Harvatek Corporation, Hsin Chu (TW)

( * ) Notice: Subject to any disclaimer, the term of this patent is extended or adjusted under 35 U.S.C. 154(b) by 97 days.

(21) Appl. No.: 10/855,417

(22) Filed: May 28, 2004

(65) Prior Publication Data

US 2005/0274957 A1    Dec. 15, 2005

(51) Int. Cl.
*H01L 33/00*    (2006.01)
(52) U.S. Cl. ......................... 257/99; 257/698
(58) Field of Classification Search .................. 257/99, 257/100, 698
See application file for complete search history.

(56) References Cited

U.S. PATENT DOCUMENTS

RE36,614 E  *  3/2000  Lumbard et al. ........... 313/500
6,531,328 B1 *  3/2003  Chen ........................... 438/26

* cited by examiner

*Primary Examiner*—Mark V. Prenty
(74) *Attorney, Agent, or Firm*—Rosenberg, Klein & Lee

(57) ABSTRACT

An LED packaging structure has a substrate having two holes formed thereon. One of two conductive elements extends through the two holes to connect electrically to a conductive pad and a first electrode pad on the upper and lower surfaces of the substrate and the other of the two conductive elements extends through the holes to connect to the conductive strip and the second electrode pad on the upper and lower surfaces the substrate. A light-emitting chip electrically connects to the conductive pad and the conductive strip. The light-emitting chip is encapsulated by a protection colloid on the substrate, so as to make LED packaging structure easy to fabricate and avoid the short circuits of adjacent LED packaging structures due to contact between conductor materials therebetween.

5 Claims, 3 Drawing Sheets

LED PACKAGING STRUCTURE

BACKGROUND OF THE INVENTION

1. Field of the Invention

The invention refers to a light-emitting diode (LED), and particularly to a packaging structure of an LED for improving fabricating yield and avoiding short circuit of adjacent LED packaging structures due to contact of their conductive elements.

2. Description of the Prior Art

Reference is made to FIG. 1, which is a prior art packaging structure of an LED as disclosed in U.S. Pat. No. Re. 36614, comprising a substrate 10a, a light-emitting chip 20a, a conducting wire 30a and a protective unit 40a (which is hereby incorporated by reference). The substrate 10a further comprises two conductor materials 50a respectively disposed on the upper surface of the substrate 10a to form a conductive pad 51a and a conductive strip 52a on the substrate 10a, respectively, and further extending respectively along the opposite half-circle side walls of the substrate 10a to the lower surface the substrate 10a to form an electrode pad 53a thereon. One side of the light-emitting chip 20a is electrically connected and secured to one of the conductive pad 51a, and the conducting wire 30a is used at both ends thereof to connected electrically and respectively to the other conductive strip 52a and the other side of the light-emitting chip 20a. Using the protection unit 40a, the light-emitting chip 20a, the conductive pad 51a, the conductive strip 52a and the conducting wire 30a are encapsulated on the upper surface of the substrate 10a.

In this case, the packaging structures of the LED are mass-manufactured by forming a plurality of LED packaging structures on a large-area substrate. To do this, a plurality of circle holes are formed on the large substrate, then the conductive pads, conductive strips and electrode pads are disposed on the upper and lower surfaces and the circle hole walls of the substrate by electroplating and etching; further, the light-emitting chips are disposed and electrically connected thereon, and then encapsulated by the protection unit on the substrate. Consequently, a plurality of interconnected LED packaging structures are formed. Finally the substrate is sliced along the direction of the aligned holes to separate the substrate into individual LED packaging structures with two opposite half-circle side walls. However, since the large-area substrate may be obliquely cut during the slicing process, this results in irregular half-circle side walls, thereby decreasing product yield.

Moreover, when a plurality of LED packaging structures are aligned in a matrix arrangement for use of display device, and two adjacent packaging structures are positioned close and thus may contact each other (as shown in FIG. 2), the half-circle side walls and the electrode pads of the adjacent LED packaging structures may be positioned close to and be in contact with each other, thereby resulting in a short-circuit. Therefore, two LED packaging structures need separated by a certain interval or a isolation element is disposed between two adjacent LED packaging structures, so as to avoid short-circuits of adjacent LED packaging structures. As a result, assembly and fabrication take longer and are more expensive, thereby leading to the degradation of the competitive power of the products.

Accordingly, this invention is provided to improve the above disadvantages with a reasonable design.

SUMMARY OF THE INVENTION

It is a first object of the present invention to provide an LED packaging structure, in which two holes are formed on a substrate thereof and two conductors extend respectively through the two holes to connect electrically to the conductive elements on the upper and lower surfaces of the substrate, whereby the LED packaging structure is easily fabricated.

It is a second object of the present invention to provide an LED packaging structure, in which the conductors extend through the holes of a substrate thereof and the conductive elements on the upper and lower surfaces of the substrate are separated from the edges of the substrate by a certain interval, thereby avoiding short-circuits of adjacent LED packaging structures due to contact therebetween.

According to the above-mentioned objects, the present invention provides an LED packaging structure, comprising the following elements. A substrate has upper and lower surfaces, and a conductive pad and conductive strip are disposed on the upper surface of the substrate, while a first electrode pad and a second electrode pad are disposed on the lower surface of the substrate. A light-emitting chip is arranged on the conductive pad and is electrically connected to the conductive pad and the conductive strip. A protection colloid encapsulates the light-emitting chip on the upper surface of the substrate.

The substrate has two holes through the upper and lower surfaces, two conductors extending respectively along the two holes such that one of the conductors is electrically connected at both of its terminals to the conductive pad and the first electrode pad, respectively, and the other conductor is electrically connected at both of its terminals to the conductive strip and the second electrode pad, respectively. Therefore, fabrication thereof is easy, and short-circuits of adjacent LED packaging structures due to contact of conductive elements thereof can be avoided.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE EMBODIMENTS

Figure 1:
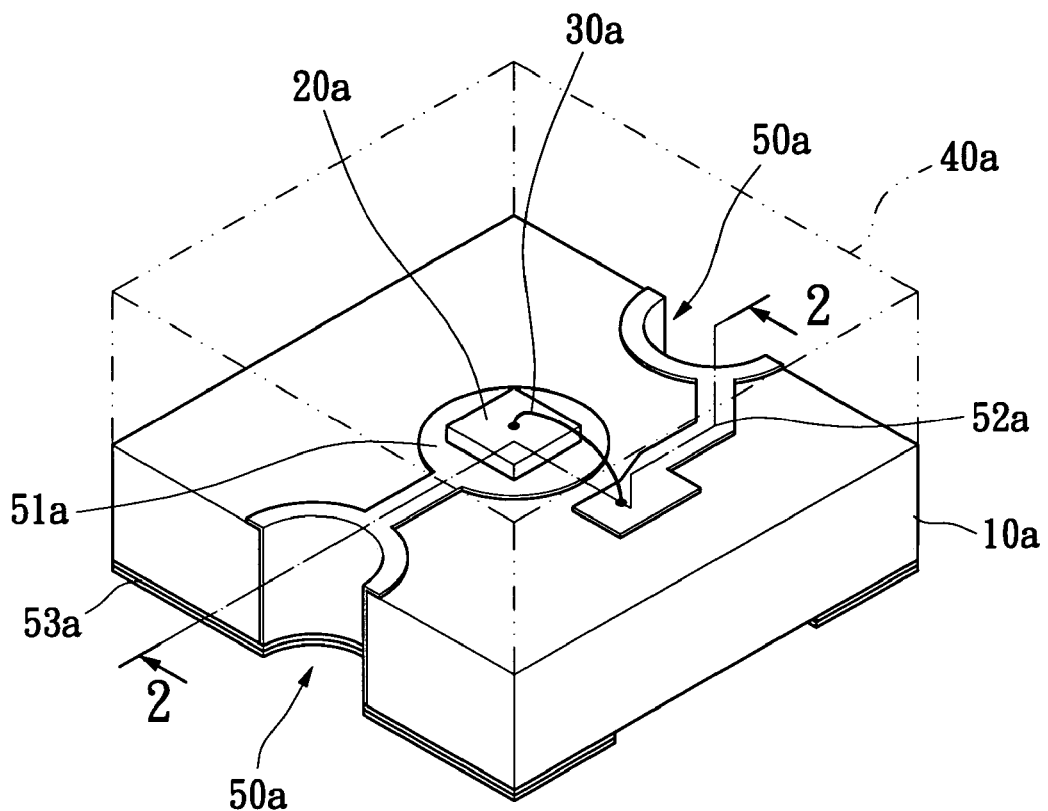
FIG. 1 is a block diagram of an LED according to the prior art.
Figure 2:
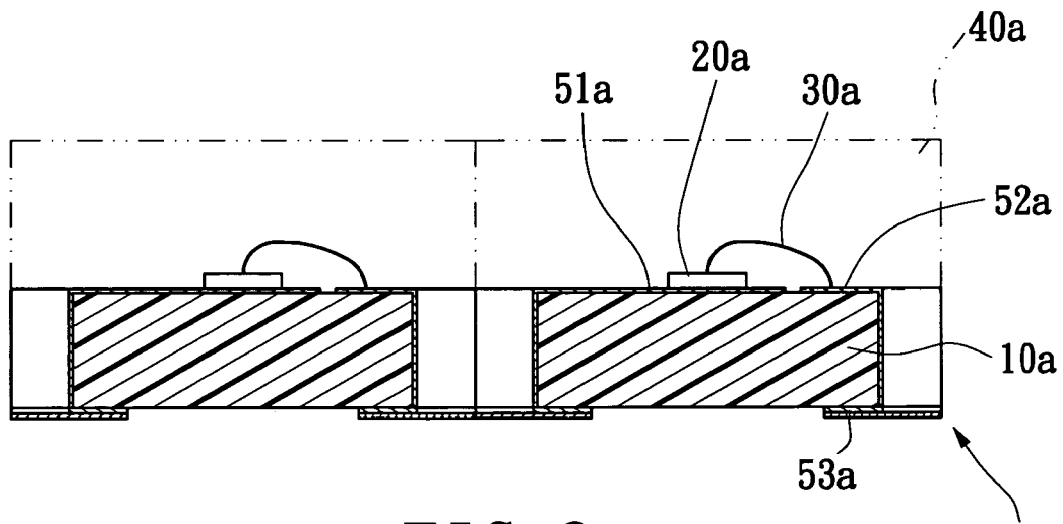
FIG. 2 is a cross-sectional assembly diagram of an LED packaging structure according to the prior art.
Figure 3:
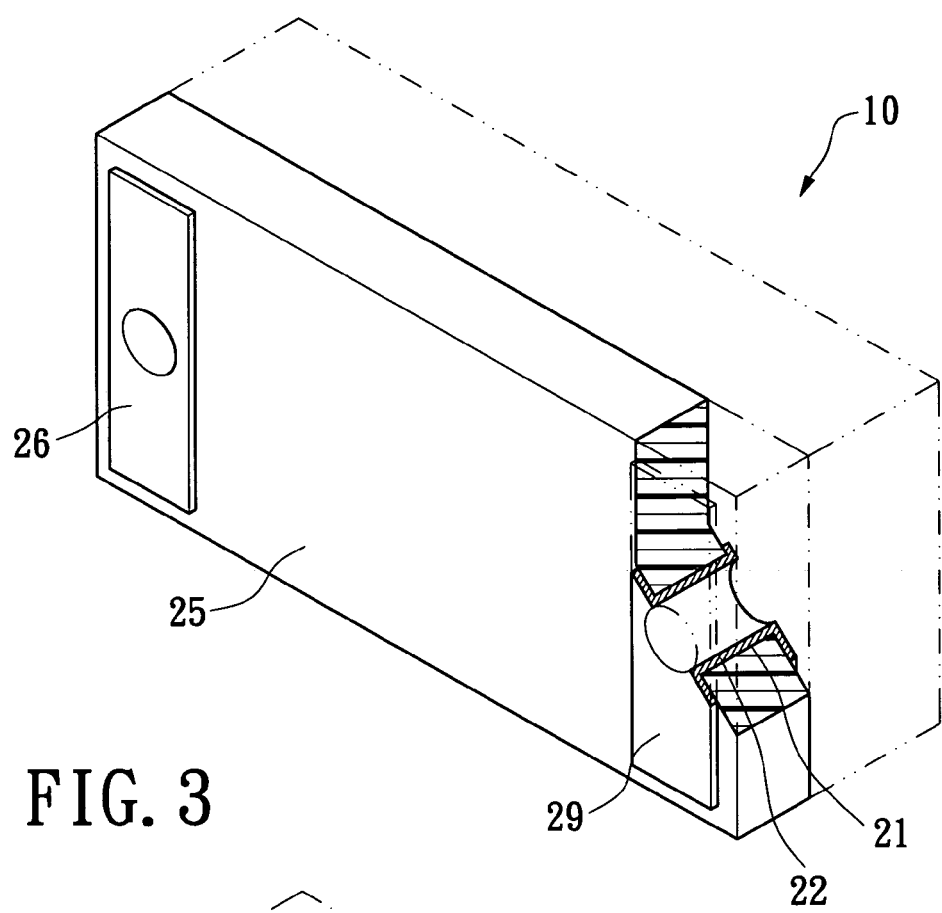
FIG. 3 is a block diagram of an LED packaging structure according to the invention, viewed from the bottom side.
Figure 4:
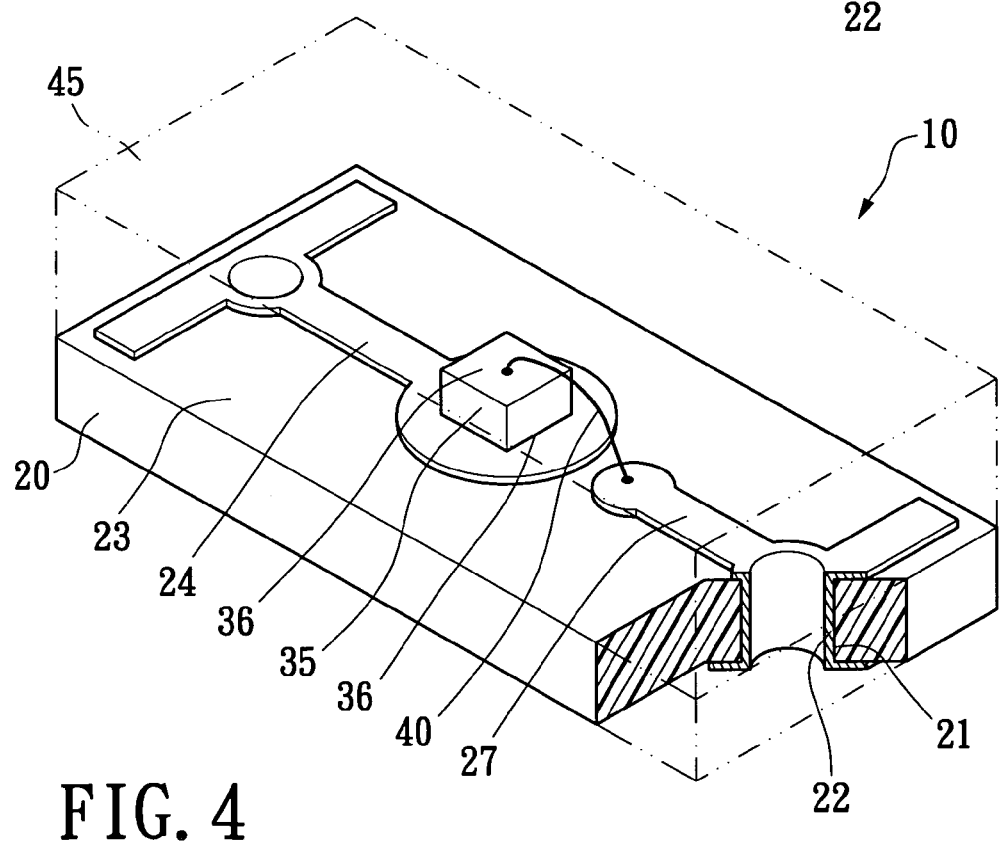
FIG. 4 is a block diagram of an LED packaging structure according to the invention.
Figure 5:
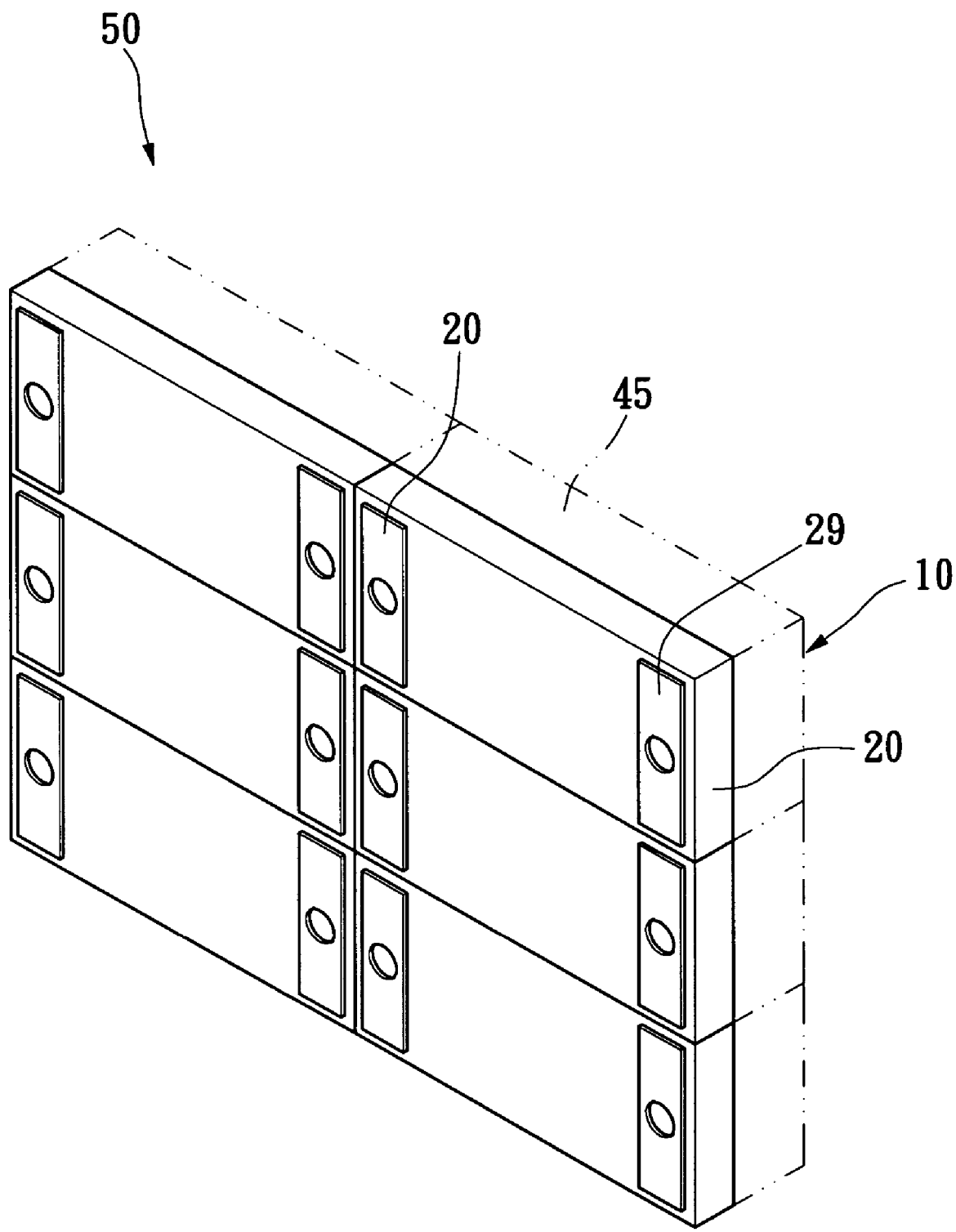
FIG. 5 is a block diagram of a matrix of a plurality of LED packaging structures according to the invention, viewed from the bottom side.

With reference to FIGS. 3 to 5, this invention is directed to an LED packaging structure 10, in which two holes 21 are formed on a substrate 20 thereof, and two conductors 22 extends along the pair of holes 21, respectively, such that one of the conductors 22 is connected to a conductive pad 24 on the upper surface 23 of the substrate 20 and a first electrode pad 26 on the lower surface 25 of the substrate 20, and the other conductor 22 is connected to a conductive strip 27 on the upper surface 23 of the substrate 20 and a second electrode pad 29 on the lower surface 25 of the substrate 20. Fabrication of the LED packaging structure 10 is thus easily performed and short-circuits between the adjacent LED packaging structures due to contact of conductive elements thereof can be avoided.

With reference to FIGS. 3 and 4, the substrate 20 has opposite upper and lower surfaces 23 and 25, and two holes 21 are formed through the upper and lower surfaces 23 and 25 on the substrate 20; the holes 21 are, for example, circular. Moreover, a conductive pad 24 and a conductive strip 27 are disposed on the upper surface 23 of the substrate 20. First and second electrode pads 26 and 29 are disposed on the lower surface 25 of the substrate 20 at opposite ends, and two conductors 22 extend through the pair of the holes 21, respectively, such that the conductors 22 are respectively connected at both terminals thereof to the conductive pad 24 on the upper surface 23 of the substrate 20 and the electrode pad 26 on the lower surface 25 of the substrate 20, respectively. The conductors 22 are, for example, cylinders and affixed to the walls of the holes 21 of the substrate 20. Additionally, the conductive pad 24 and the conductive strip 27 are separated by a certain interval from the edges of the adjacent substrate 20, while the first and second electrode pads 26 and 29 are are separated by a certain interval, respectively, from the edges of the substrate 20.

The light-emitting chip 35 is, for example, a light-emitting diode (LED), arranged on the conductive pad 24. The light-emitting chip 35 has two electrodes 36, one of which is electrically connected to the conductive pad 24 and the other of which is electrically to the conductive strip 27 via a electro-conducting wire 40.

The protection colloid 45 is, for example, a transparent colloid, for encapsulating the light-emitting chip 35, the conductive pad 24 and the conductive strip 27 on the upper surface 23 of the substrate 20 to form an LED packaging structure 10.

With reference to FIG. 5, in the case that a plurality of LED packaging structures 10 is arranged in a matrix for forming a large-scale display panel 50, the pair of conductors 22 are arranged through the holes 21 and the upper surface 23 of the substrate 20. The conductive pad 24 and the conductive strip 27 on the upper surface 23 of the substrate 20 are respectively separated from the edges of the adjacent substrate 20 by a certain interval, and the first and second electrode pads 26 and 29 on the lower surface 25 of the substrate 20 are respectively separated from the edges of the adjacent substrate 20 by a certain interval, so as to avoid short-circuits of adjacent LED packaging structures 10 due to contact between conductive elements thererof. Therefore, it is applicable for a plurality of LED packaging structures arranged in a matrix for forming a display panel 50.

Therefore, the fabrication process is performed according to the following steps of fabricating LED packaging structures. A plurality of holes 21 are formed on a substrate 10. The upper and lower surfaces 23 and 25 of the substrate 20 and the walls of the holes 21 are further plated with conductive materials by electroplating. Undesired portions are removed by etching to form the conductive pad 24, the conductive strip 27, the first and second electrode pads 26 and 29, and the conductors 22. A plurality of light-emitting chips 35 are disposed on the surface 23 of the substrate 20 and electrically connected to the conductive elements. The plurality of light-emitting chips 35 are encapsulated on the substrate 20 with a protection colloid 45 to form a plurality of interconnected LED packaging structures 10. Finally, the substrate 20 is sliced along the gaps between adjacent conductive elements to form a plurality of separate LED packaging structures 10, thereby increasing fabrication speed. Therefore, it is unnecessary to slice the walls of the holes across the holes, thus improving fabricating yield, speed and workability.

In conclusion, the LED packaging structure according to the invention is arranged to have two holes formed on a substrate and two conductors extending through the two holes respectively to connect electrically to the conductive elements on the upper and lower surfaces of the substrate. The structure is thus easy to fabricate. Moreover, the conductors extend through the holes of the substrate, and the conductive elements on the upper and lower surfaces of the substrate are separated from the edges of the substrate by a certain interval, so as to avoid short-circuits of adjacent LED packaging structures due to contact between conductive elements thereof. Fabrication processes and cost are thereby reduced.

Although possible embodiments of the invention have been described above, it is to be understood that the scope of the invention is not limited to these embodiments; in the same way, all equivalent structures and modifications as implemented in this specification and as illustrated in these drawings are covered within the scope of this invention, in order to protect the right of the inventor.

What is claimed is:

1. An LED packaging structure including a substrate having opposite upper and lower surfaces and surrounding edges of said LED packaging structure, a conductive pad and a conductive strip formed on the upper surface of the substrate, and a first and second electrode pads formed on the lower surface of the substrate, a light-emitting chip arranged on the conductive pad and electrically connected to the conductive pad and the conductive strip, the light-emitting chip being encapsulated by a protection colloid on the upper surface of the substrate, the LED packaging structure comprising:

a pair of holes extending through said substrate between the upper and lower surfaces thereof, each of said pair of holes having walls circumferentially surrounding a cylindrically shaped hole channel; and two conductors, each extending along said walls of a respective one of said pair of holes and covering said walls in closedly surrounding relationship with said hole channel, respectively, wherein one of said two conductors is connected at both ends thereof to the conductive pad and the first electrode pad, respectively, and another one of said two conductors is connected at both ends thereof to the conductive strip and the second electrode pad, respectively, wherein said conductive pad and said conductive strip formed on the upper surface of the substrate, and said first and second electrode pads formed on said lower surfaces of the substrate are displaced from said surrounding edges of said LED packaging structure a predetermined distance.

2. The LED packaging structure according to claim 1, wherein the conductors are cylindrical in shape.

3. The LED packaging structure according to claim 1, wherein the protection colloid is a transparent isolation colloid.

4. The LED packaging structure according to claim 1, further comprising at least a pair of said LED packaging structures disposed adjacent each to the other, wherein said predetermined distance is sufficient to prevent shorting between said conductive pad, the conductive strip, said first and second electrodes and each of said pair of conductors, respectively, of said adjacent LED packaging structures.

5. The LED packaging structure according to claim 1, further comprising an electro-conducting wire, electrically connected between the light-emitting chip and the conductive strip.

* * * * *